United States Patent
Chung et al.

(10) Patent No.: US 9,593,427 B2
(45) Date of Patent: Mar. 14, 2017

(54) METHOD FOR FORMING PATTERN AND CATALYST AND ELECTRONIC ELEMENT USING METHOD THEREFOR

(71) Applicants: SNU R&DB FOUNDATION, Seoul (KR); GLOBAL FRONTIER CENTER FOR MULTISCALE ENERGY SYSTEMS, Seoul (KR)

(72) Inventors: Taek Dong Chung, Gwacheon-si (KR); Sung Yul Lim, Seoul (KR)

(73) Assignees: SNU R&DB FOUNDATION, Seoul (KR); GLOBAL FRONTIER CENTER FOR MULTISCALE ENERGY SYSTEMS, Seoul (KR)

( * ) Notice: Subject to any disclaimer, the term of this patent is extended or adjusted under 35 U.S.C. 154(b) by 0 days.

(21) Appl. No.: 14/651,903

(22) PCT Filed: Jul. 25, 2013

(86) PCT No.: PCT/KR2013/006658
§ 371 (c)(1),
(2) Date: Jun. 12, 2015

(87) PCT Pub. No.: WO2015/005517
PCT Pub. Date: Jan. 15, 2015

(65) Prior Publication Data
US 2016/0108536 A1 Apr. 21, 2016

(30) Foreign Application Priority Data
Jul. 11, 2013 (KR) .................. 10-2013-0081790

(51) Int. Cl.
*H01L 29/06* (2006.01)
*C25D 5/02* (2006.01)
(Continued)

(52) U.S. Cl.
CPC .............. *C25D 5/024* (2013.01); *C25D 9/02* (2013.01); *C25D 9/08* (2013.01); *H01L 21/0242* (2013.01);
(Continued)

(58) Field of Classification Search
CPC .............. H01L 27/322; H01L 51/0048; H01L 51/0052; H01L 27/124; H01L 27/1292;
(Continued)

(56) References Cited

U.S. PATENT DOCUMENTS 4,075,013 A * 2/1978 Ward .................. G03G 5/0436
                                                        205/159
4,883,579 A * 11/1989 Humphries ............ C12Q 1/004
                                                        204/403.08
(Continued)

FOREIGN PATENT DOCUMENTS

JP        H0649679 A     2/1994
JP       2003265949 A    9/2003
(Continued)

OTHER PUBLICATIONS

International Search Report-PCT/KR2013/006658 dated Apr. 28, 2014.
(Continued)

*Primary Examiner* — Mohammed Shamsuzzaman
(74) *Attorney, Agent, or Firm* — Cantor Colburn LLP

(57) ABSTRACT

Provided are a method for forming a pattern, and a catalyst and an electronic element using the method. The method for forming a pattern comprises the steps of: preparing, on a surface, a substrate sequentially including a photoconductive material layer and an oxide layer; making an area, on which a pattern is to be formed, on the oxide layer of the substrate, come into contact with an electrolyte; connecting the substrate and the electrolyte to a first electrode and a
(Continued)

second electrode connected to a power source, respectively; and selectively irradiating light from a light source to the electrolyte and applying a voltage to the first electrode or the second electrode, thereby directly forming the pattern on the oxide layer of the substrate.

17 Claims, 5 Drawing Sheets

(51) Int. Cl.
*H01L 31/18* (2006.01)
*H01L 51/00* (2006.01)
*H01L 21/02* (2006.01)
*C25D 9/02* (2006.01)
*C25D 9/08* (2006.01)
*C25D 3/50* (2006.01)
*C25D 17/10* (2006.01)

(52) U.S. Cl.
CPC .... *H01L 21/0256* (2013.01); *H01L 21/02628* (2013.01); *H01L 21/02639* (2013.01); *H01L 31/1884* (2013.01); *H01L 51/0014* (2013.01); *C25D 3/50* (2013.01); *C25D 17/10* (2013.01); *Y02E 10/549* (2013.01)

(58) Field of Classification Search
CPC ... H01L 31/046; H01L 35/32; H01L 21/0242; C25D 5/024
USPC .......... 257/618, 414, 43; 438/149, 486, 209
See application file for complete search history.

(56) References Cited

U.S. PATENT DOCUMENTS

| | | | | |
|---|---|---|---|---|
| 5,445,997 | A * | 8/1995 | Fujishima | H01L 21/3081 257/E21.216 |
| 6,194,108 | B1 * | 2/2001 | Akutsu | G03G 15/34 430/32 |
| 6,436,591 | B1 * | 8/2002 | Ohtsu | G02B 5/201 205/124 |
| 2001/0024761 | A1 * | 9/2001 | Ohtsu | G03G 17/02 430/32 |
| 2002/0132454 | A1 * | 9/2002 | Ohtsu | C23C 14/083 438/486 |
| 2003/0087073 | A1 * | 5/2003 | Kobayashi | B82Y 30/00 428/209 |
| 2011/0102362 | A1 * | 5/2011 | Fang | G02F 1/15 345/174 |
| 2014/0001049 | A1 * | 1/2014 | Moffat | C25D 3/50 205/104 |
| 2015/0083465 | A1 * | 3/2015 | Yun | G06F 3/041 174/251 |
| 2015/0275386 | A1 * | 10/2015 | Ryu | H01L 29/0669 257/43 |

FOREIGN PATENT DOCUMENTS

| | | |
|---|---|---|
| KR | 100586609 | 5/2006 |
| KR | 1020070070753 | 7/2007 |
| KR | 1020100020756 | 2/2010 |
| KR | 1020100133600 | 12/2010 |

OTHER PUBLICATIONS

Sung Yui Lim, et al. "Optoelectrochemical Reactions on Hydrogenated Amorphous Silicon Electrodes", The 63rd Annual Meeting of the International Society of Electrochemistry, Prague, Czech Republic, Aug. 19, 2012, see the entire document.
Written Opinion-PCT/KR2013/006658 dated Apr. 28, 2014.

* cited by examiner

METHOD FOR FORMING PATTERN AND CATALYST AND ELECTRONIC ELEMENT USING METHOD THEREFOR

TECHNICAL FIELD

One or more exemplary embodiments relate to a method for forming a pattern and a catalyst and an electronic element using the method.

BACKGROUND ART

A method for forming a pattern on a surface of a metal, a semiconductor, glass, or an oxide, that is, a surface patterning technique, is one of industrial core technologies which may be applied to various purposes from a semiconductor industry to displays, vehicles, human body medical industries, and furthermore to aerospace industries.

The surface patterning technique up to date has been mainly achieved by photolithography using a polymer thin film as a photoresist. The photolithography refers to a method of manufacturing a photoresist pattern on a substrate by preparing a thin film by spin coating a photoresist on a flat substrate, placing a photomask thereon, and irradiating light of an appropriate wavelength for a certain period of time to selectively leave the photoresist thereon or remove the photoresist therefrom. The photolithography may repeatedly transfer a pattern of having a size of a photomask mold on the desired substrate, and the photolithography enables manufacture of a nanosized pattern.

However, the manufacture of the photomask costs great expense, several processes are needed to obtain a desired pattern, and since a light-sensitive photoresist is used, a region may be contaminated without intention. Also, high vacuum is required in the general deposition process, and thus a high expense is needed in purchase of the equipment and environmental pollution may generate due to a toxic solvent used in the etching process.

Therefore, a method for forming a pattern with reduced cost and time is needed, where the method is simple in its process and environmental friendly.

DETAILED DESCRIPTION OF THE INVENTION

Technical Problem

The present invention provides a method for forming a pattern, the method includes directly forming a pattern on an oxide layer formed on a photoconductive material layer.

The present invention provides a catalyst using the method for forming a pattern.

The present invention provides an electronic element using the method for forming a pattern.

Technical Solution

According to an aspect of the present invention, there is provided a method for forming a pattern includes preparing a substrate sequentially including a photoconductive material layer and an oxide layer on a surface of the substrate; making an area, on which a pattern is to be formed, on the oxide layer of the substrate, come into contact with an electrolyte; connecting the substrate and the electrolyte to a first electrode and a second electrode connected to a power source, respectively; and selectively irradiating light from a light source to the electrolyte and applying a voltage to the first electrode or the second electrode to form the pattern directly on the oxide layer of the substrate.

The photoconductive material layer may include a first photoconductive material layer of a p-type or an n-type and a second photoconductive material layer of an intrinsic-type (i-type).

The photoconductive material layer further may include a third photoconductive material layer of an n-type or a p-type.

The photoconductive material layer may include at least one selected from crystalline silicon, amorphous silicon (a-Si), hydrogenated amorphous silicon (a-Si:H), amorphous germanium, hydrogenated amorphous germanium/silicon (a-Ge:H/a-Si—H), amorphous selenium (a-Se), amorphous gallium (a-Ga), amorphous hematite, and amorphous titanium oxide.

A thickness of the photoconductive material layer may be in a range of about 200 nm to about 900 nm.

A thickness of the first photoconductive material layer may be in a range of about 10 nm to about 30 nm.

A thickness of the second photoconductive material layer may be in a range of about 200 nm to about 700 nm.

A thickness of the third photoconductive material layer may be in a range of about 50 nm to about 150 nm.

The substrate may be a conductive substrate.

The oxide layer may include a native oxide layer, a $SiO_2$ layer, a $Si_3N_4$ layer, or a $HfO_2$ layer.

A thickness of the oxide layer may be in a range of about 0.1 nm to about 3 nm. The electrolyte may include at least one selected from a Pt precursor, a $MoO_yS_z$, (where, $0 \leq y \leq 1$ and $1.9 \leq z \leq 2.1$) precursor, a CdSe precursor, and a poly(3,4-ethylenedioxythiophene):poly(styrenesulfonate) (PEDOT:PSS) precursor.

A pH of the electrolyte may be in a range of about 4 to about 7.

A range of the applied voltage may be in a range of about −0.7 V to about −0.4 V vs. an Ag/AgCl electrode.

According to one or more exemplary embodiments, there is provided a catalyst by using the method.

According to one or more exemplary embodiments, there is provided an electronic element by using the method.

Advantageous Effects

According to one or more of exemplary embodiments, a method for forming a pattern, where the method which enables simple process, reduces manufacturing cost and time, and is environmental-friendly by directly forming a pattern on an oxide layer, for example, a native oxide layer, by using light from a light source and an electrochemical reaction and not using an etching process, wherein the oxide layer is formed on a photoconductive material layer of a substrate.

BEST MODE

Figure 1:
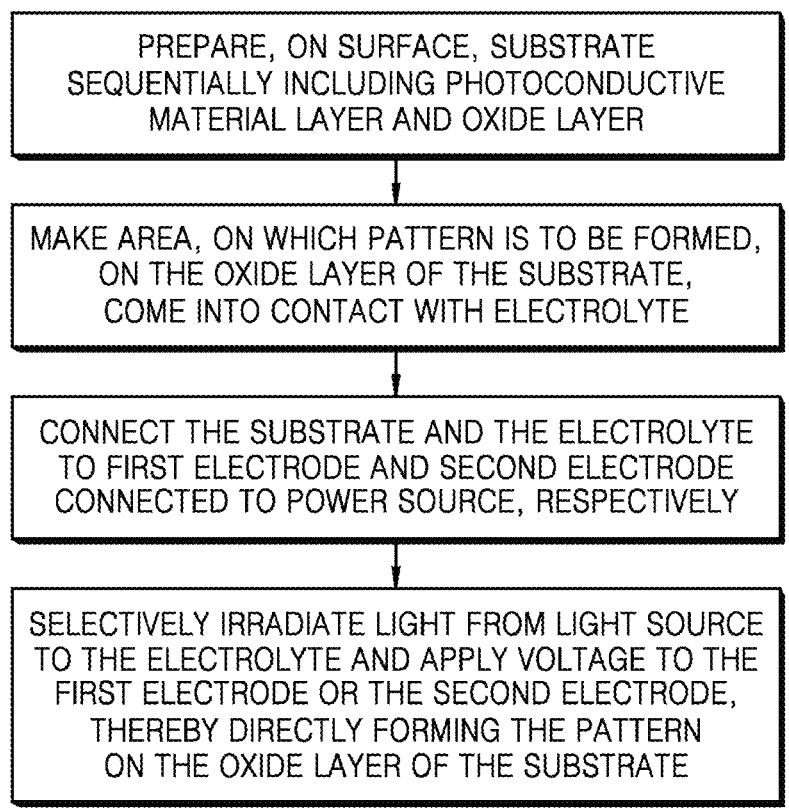
FIG. 1 is a flowchart that describes a method for forming a pattern according to an embodiment in a sequential order.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the exemplary embodiments are merely described below, by referring to the figures, to explain aspects of the present description.

The term "a photoconductive material layer" used herein refers to a material that absorbs light energy when light is shed on a surface thereof and thus increases an amount of a charged material and an electric conductivity of the layer, wherein the increased electric conductivity when exposed to a light source may be sufficient to generate an electrochemical reaction.

The term "a first electrode and a second electrode" used herein refers to "a cathode and an anode" or "an anode and a cathode" which has a three-electrode system including a working electrode, a reference electrode, and a counter electrode.

The term "p-type or n-type" refers to "p-doped type" or "n-doped type", respectively.

FIG. 1 is a flowchart that describes a method for forming a pattern according to an embodiment in a sequential order.

Referring to the flowchart of FIG. 1, a substrate sequentially including a photoconductive material layer and an oxide layer is prepared.

The photoconductive material layer may include a first photoconductive material layer, which is a p-type or an n-type, and a second photoconductive material layer, which is an i-type (intrinsic-type). The second photoconductive material layer of an i-type refers to an intrinsic layer that does not include any of an acceptor or a donor added to a photoconductive material, and the layer serves to increase a collection efficiency of electron-hole pairs (EHPs) generated by a light source. The second photoconductive material layer may be depleted by contacting with the first photoconductive material layer. Here, a diffusion length of a second conductive material is preferred to be in a range of about 100 nm to about 400 nm. The diffusion length denotes a length up to which charge carriers such as electrons and holes may diffuse, wherein the charge carriers are generated by excitation caused by light. When the diffusion length is 900 nm or greater, an electro chemical reaction may occur up to an area other than where light is irradiated, that is, an area on which a pattern is not to be formed. Also, when the diffusion length is 100 nm or less, an electro chemical reaction caused by light irradiation may not occur.

The photoconductive material layer may further include a third photoconductive material layer of an n-type or a p-type. Also, the photoconductive material layer may be a p-i type or an n-i type, or a p-i-n type or an n-i-p type. For example, when the photoconductive material layer is a p-i-n type, electrons are transfers to an interface between the photoconductive material and an electrolyte due to a potential profile, and thus a reduction reaction may occur at the interface. When the photoconductive material layer is an n-i-p type, an oxidation reaction may occur at the interface.

The photoconductive material layer may include at least one selected from crystalline silicon, amorphous silicon (a-Si), hydrogenated amorphous silicon (a-Si:H), amorphous germanium, hydrogenated amorphous germanium/silicon (a-Ge:H/a-Si—H), amorphous selenium (a-Se), amorphous gallium (a-Ga), amorphous hematite, and amorphous titanium oxide.

For example, the photoconductive material layer may include at least one selected from amorphous silicon (a-Si), hydrogenated amorphous silicon (a-Si:H), amorphous selenium (a-Se), amorphous gallium (a-Ga), amorphous hematite, and amorphous titanium oxide. The amorphous photoconductive material layer is may be used as a photoconductive material layer due to its relatively short diffusion length compared to that of a crystalline photoconductive material layer.

The photoconductive material layer may be, for example, hydrogenated amorphous silicon (a-Si:H). A defect density of the photoconductive material layer may be high since amorphous silicon included in the layer does not have regularity, and thus it is necessary to reduce localized states in the energy band by performing passivation of dangling bonds to compensate the high defect density. In this regard, hydrogenated amorphous silicon (a-Si:H) may be prepared by hydrogenating amorphous silicon is preferable.

An amount of hydrogen included in the hydrogenated amorphous silicon may be, for example, in a range of about 5% to about 18%. When the amount of hydrogen in the hydrogenated amorphous silicon is less than 5%, passivation of dangling bonds may not be performed, and thus intrinsic amorphous silicon may not be stabilized. Also, when the amount of hydrogen in the hydrogenated amorphous silicon is greater than 18%, an amount of soluble hydrogen is too high which remains in the form of hydrogen atoms, and as the hydrogen atoms may be easily converted into hydrogen gas even with a small amount of energy (heat or voltage), an electrode thus prepared may have pores.

A thickness of the photoconductive material layer may be, for example, in a range of about 200 nm to about 900 nm. A thickness of the first photoconductive material layer in the photoconductive material layer may be, for example, in a range of about 10 nm to about 30 nm. A thickness of the second photoconductive material layer in the photoconductive material layer may be, for example, in a range of about 200 nm to about 700 nm. When the thickness of the second photoconductive material layer is equal to or less than 200 nm, pool of charge carriers that may be generated on the substrate by light may be limited, and when the thickness of the second photoconductive material layer is equal to or greater than 700 nm, the thickness is thicker than an interval where a potential profile of the second photoconductive material layer may be formed. A thickness of the third photoconductive material layer in the photoconductive material layer may be, for example, in a range of about 50 nm to about 150 nm.

The substrate may be a conductive substrate. For example, the substrate may include metal, crystalline silicon, or indium tin oxide (ITO). A thickness of the substrate may be, for example, about 100 nm to about 800 μm. When the thickness of the substrate is less than 100 nm, contact between the substrate and the photoconductive material layer may be unstable, and thus resistance may occur, and, when the thickness of the substrate is greater than 800 μm, a manufacturing cost of the substrate increases.

Examples of a method of forming a photoconductive material layer on the substrate may include plasma chemical vapor deposition, hot wire chemical vapor deposition, atomic layer deposition, sputtering, laser ablation, arc-discharge, and E-beam vapor deposition. A method for forming a photoconductive material layer on the substrate may be, for example, a plasma chemical vapor deposition method or a hot wire chemical vapor deposition method.

The oxide layer of the substrate may include a native oxide layer, a $SiO_2$ layer, a $Si_3N_4$ layer, or a $HfO_2$ layer. For example, a thickness of the oxide layer may be in a range of about 0.1 nm to about 3 nm. For example, the native oxide layer may be formed by forming a layer (a native oxide layer) having a thickness in a range of about 0.1 nm to about 3 nm on the second photoconductive material layer or the third photoconductive material layer by exposing the substrate including the photoconductive material layer to the air for about 1 day to about 4 weeks. For example, the $SiO_2$ layer, the $Si_3N_4$ layer, or the $HfO_2$ layer may be formed in the same manner as in the method for forming the photoconductive material layer before forming the native oxide layer on the photoconductive material layer or in the same manner as in the method for forming the photoconductive material layer after etching the native oxide layer formed on the photoconductive material layer by using an acid solution.

Next, an area, on which a pattern is to be formed, on the oxide layer of the substrate, is made to come into contact with an electrolyte.

The area, on which a pattern is to be formed includes a part on the oxide layer or the whole area, and the electrolyte may be in contact with an area that is the same or larger than the area, on which the pattern is to be formed. Examples of a method of making an area, on which a pattern is to be formed, on the oxide layer of the substrate, come into contact with an electrolyte may include dipping, immersing, and spraying, but embodiments are not limited thereto, and any method available in the art to contact the electrolyte to the area may be used.

The electrolyte may include at least one selected from a Pt precursor, a $MoO_yS_z$ (where, $0 \leq y \leq 1$ and $1.9 \leq z \leq 2.1$) precursor, a CdSe precursor, and a poly(3,4-ethylenedioxythiophene):poly(styrenesulfonate) (PEDOT:PSS) precursor. Examples of the Pt precursor may include $H_2PtCl_4$ and $K_2SO_4$, examples of the $MoO_yS_z$ (where, $0 \leq y \leq 1$, $1.9 \leq z \leq 2.1$) precursor may include $Na_2MoO_4$ and $Na_2S$, examples of the CdSe precursor may include $CdSO_4 \cdot 3H_2O$ and 1 mM $SeO_2$, and examples of the PEDOT:PSS precursor may include EDOT and PSS.

A pH of the electrolyte may be in a range of about 4 to about 7.

When the substrate sequentially including the photoconductive material layer and the oxide layer (e.g., a native oxide layer) is in contact with the electrolyte, electrochemical behavior of an interface between the native oxide layer and the photoconductive material layer according to pH of the electrolyte is as follows.

Figure 2A:
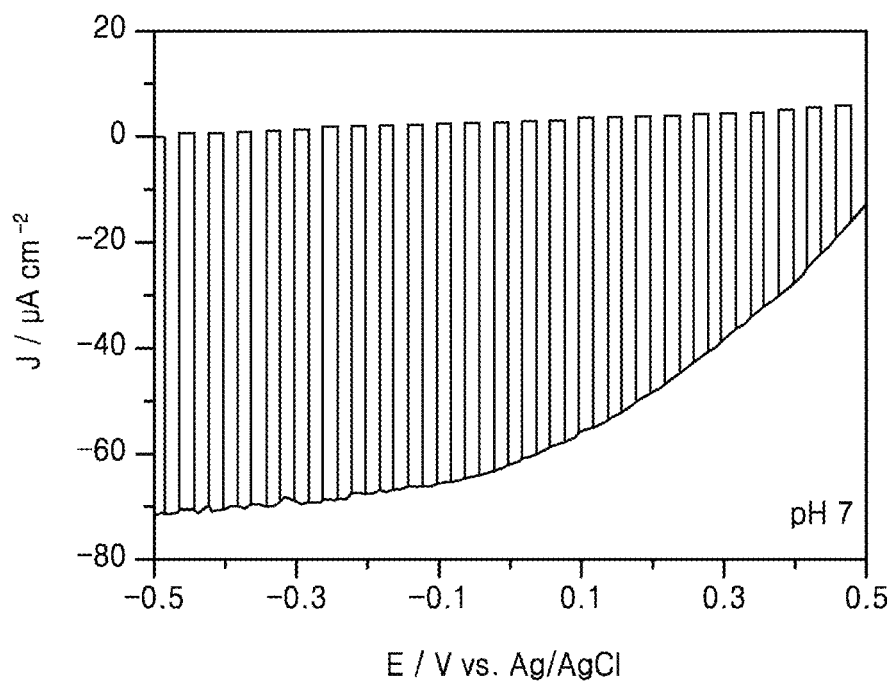
FIG. 2A is a linear sweep voltammogram (LSV) graph obtained after contacting an area of the substrate according to an embodiment to an electrolyte of pH 7 prepared by adding 0.1 M $Ru(NH_3)_6^{3+}$ to a buffer solution of 0.1 M phosphate and 0.2 M KCl, connecting three electrodes, selectively irradiating light from a collimated LED light source at a wavelength of 632.8 nm, and applying a linear voltage in arrange of about 0.5 V to about −0.5 V vs. an Ag/AgCl electrode to one electrode. In the graph, a scanning rate of a red line is 5 mV/s, and a scanning rate of a black line is 75 mV/s. The red line is obtained at a state under which constant light is continuously irradiated from the light source, and the black line is obtained at a state under which light is controlled to (have a frequency of) 3.76 Hz.
Figure 2B:
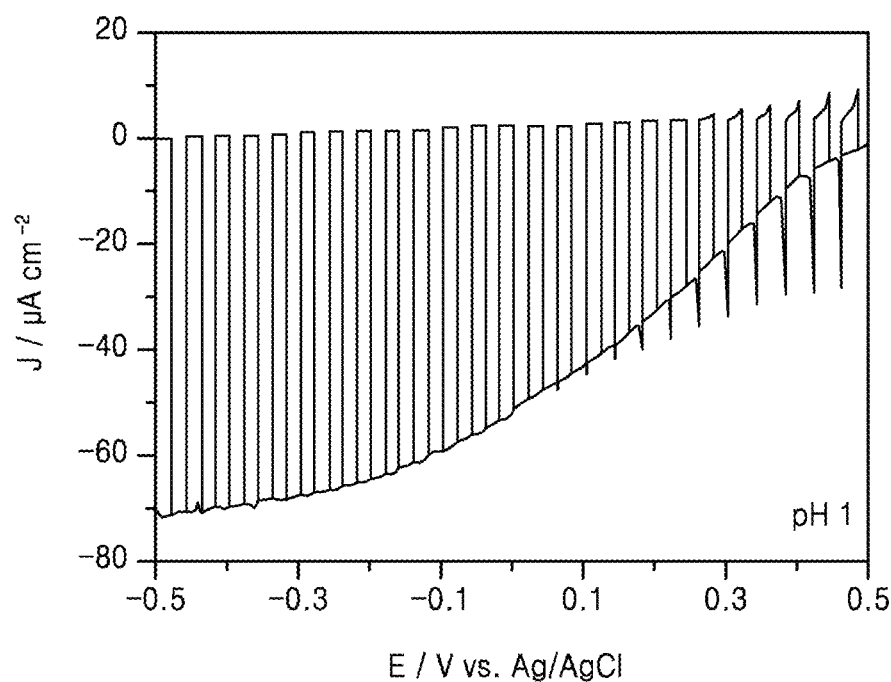
FIG. 2B is a LSV graph obtained after contacting an area of the substrate according to an embodiment to an electrolyte of pH 1 prepared by adding 0.1 M $Ru(NH_3)_6^{3+}$ to a buffer solution of 0.1 M HCl and 0.2 M KCl, connecting three electrodes, selectively irradiating light from a collimated LED light source at a wavelength of 632.8 nm, and applying a linear voltage in arrange of about 0.5 V to about −0.5 V vs. an Ag/AgCl electrode to one electrode. In the graph, a scanning rate of a red line is 5 mV/s, and a scanning rate of a black line is 75 mV/s. The red line is obtained at a state under which constant light is continuously irradiated from the light source, and the black line is obtained at a state under which light is controlled to (have a frequency of) 3.76 Hz.

FIG. 2A is a linear sweep voltammogram (LSV) graph obtained after contacting an area of the substrate according to an embodiment to an electrolyte of pH 7 prepared by adding 0.1 M $Ru(NH_3)_6^{3+}$ to a buffer solution of 0.1 M phosphate and 0.2 M KCl, connecting three electrodes, selectively irradiating light from a collimated LED light source at a wavelength of 632.8 nm, and applying a linear voltage in arrange of about 0.5 V to about –0.5 V vs. an Ag/AgCl electrode to one electrode. In the graph, a scanning rate of a red line is 5 mV/s, and a scanning rate of a black line is 75 mV/s. The red line is obtained at a state under which constant light is continuously irradiated from the light source, and the black line is obtained at a state under which light is controlled to (have a frequency of) 3.76 Hz. FIG. 2B is a LSV graph obtained after contacting an area of the substrate according to an embodiment to an electrolyte of pH 1 prepared by adding 0.1 M $Ru(NH_3)_6^{3+}$ to a buffer solution of 0.1 M HCl and 0.2 M KCl, connecting three electrodes, selectively irradiating light from a collimated LED light source at a wavelength of 632.8 nm, and applying a linear voltage in arrange of about 0.5 V to about –0.5 V vs. an Ag/AgCl electrode to one electrode. In the graph, a scanning rate of a red line is 5 mV/s, and a scanning rate of a black line is 75 mV/s.

The red line is obtained at a state under which constant light is continuously irradiated from the light source, and the black line is obtained at a state under which light is controlled to (have a frequency of) 3.76 Hz. The LSV graph is obtained by using Gamry Reference 600 (available from Gemry Instruments), and a potential pulse is measured by using a CHI 440 electrochemical workstation (available from CH instrumentations).

When 0.1 M $Ru(NH_3)_6^{3+}$ is added to the electrolyte solution instead of a metal precursor, an accepting rate of charges generated on a surface between the outer-most amorphous silicon and the native oxide layer increases and no change occurs on a surface of the photoconductive material layer, and thus observation of change in charge transfer at the interface between the native oxide layer and the photoconductive material layer may be easily performed. Therefore, 0.1 M $Ru(NH_3)_6^{3+}$ is added to the electrolyte solution instead of a metal precursor.

Referring to FIGS. 2A and 2B, in the LSV graph of FIG. 2A, where an area of the substrate is in contact with the electrolyte of pH 7, a peak having a spike shape is not observed within a range of about 0.2 V to about 0.5 V vs. an Ag/AgCl electrode, but in the LSV graph of FIG. 2B, where an area of the substrate is in contact with the electrolyte of pH 1, a peak having a spike shape is observed within a range of about 0.2 V to about 0.5 V vs. an Ag/AgCl electrode. The peak having a spike shape denotes a surface combination, which is recombination of surfaces at an interface of the native oxide layer and the photoconductive material layer herein, and this has been known as caused by slow charge transfer through an interface with a dominant proton-coupled faradaic reaction between the native oxide layer and the photoconductive material layer.

In this regard, since the peak having a spike shape is not observed when the electrolyte of pH 7 is used, it is deemed that a pathway of the photoconductive material layer through the oxide layer is blocked due to lack of protons and, instead, charges excited by direct tunneling through the native oxide layer are rapidly transferred to oxidation-reduction molecules of the electrolyte from a conduction band, compared to the case when the electrolyte of pH 1 is used.

Figure 3:
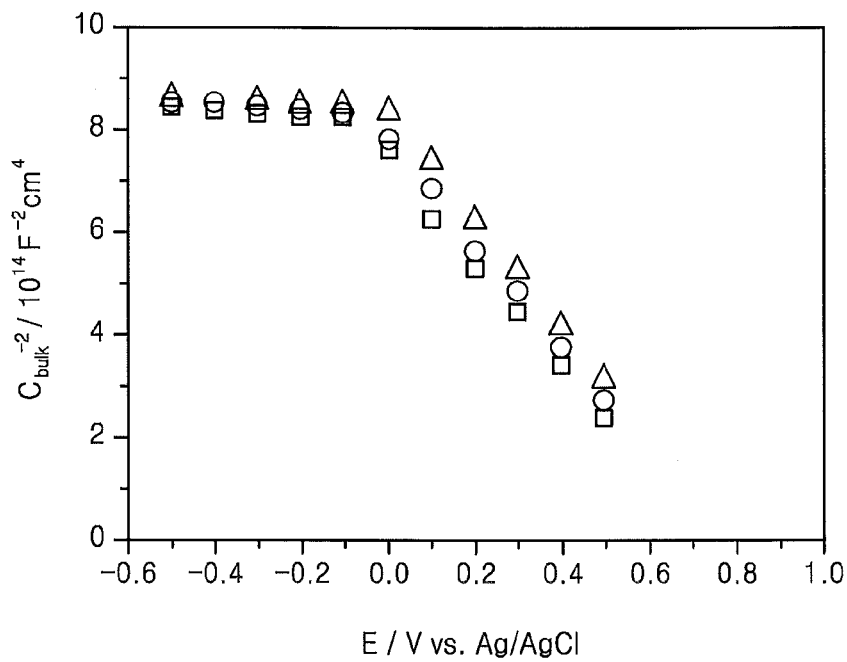
FIG. 3 is a Mott-Schottky graph obtained by calculating based on the electrochemical impedance spectroscopy results measured by contacting an area of the substrate according to an embodiment to an electrolyte of pH 1 prepared by adding 0.1 M $Ru(NH_3)_6^{3+}$ to a buffer solution of 0.1 M HCl and 0.2 M KCl, an electrolyte of pH 4 prepared by adding 0.1 M $Ru(NH_3)_6^{3+}$ to 0.1 M potassium acetate ($CH_3CO_2K$), or an electrolyte of pH 7 prepared by adding 0.1 M $Ru(NH_3)_6^{3+}$ to a buffer solution of 0.1 M phosphate and 0.2 M KCl, connecting three electrodes, selectively irradiating light from a collimated LED light source at a wavelength of 632.8 nm, and applying a linear voltage in arrange of about 0.5 V to about −0.5 V in a unit of 0.1 V vs. an Ag/AgCl electrode to one electrode.

FIG. 3 is a Mott-Schottky graph obtained by calculating based on the electrochemical impedance spectroscopy results measured by contacting an area of the substrate according to an embodiment to an electrolyte of pH 1 prepared by adding 0.1 M $Ru(NH_3)_6^{3+}$ to a buffer solution of 0.1 M HCl and 0.2 M KCl, an electrolyte of pH 4 prepared by adding 0.1 M $Ru(NH_3)_6^{3+}$ to 0.1 M potassium acetate ($CH_3CO_2K$), or an electrolyte of pH 7 prepared by adding 0.1 M $Ru(NH_3)_6^{3+}$ to a buffer solution of 0.1 M phosphate and 0.2 M KCl, connecting three electrodes, selectively irradiating light from a collimated LED light source at a wavelength of 632.8 nm, and applying a linear voltage in arrange of about 0.5 V to about −0.5 V in a unit of 0.1 V vs. an Ag/AgCl electrode to one electrode.

Referring to FIG. 3, a slope that is more negative than a potential area having a positive potential greater than 0 V denotes a p-type photoconductive material layer the native oxide layer formed thereon. This is because a band inside the p-i-n type is bent down. This bent band is protected from an electrolyte by an n-type photoconductive material layer. Thus, a band structure of p-type in the p-i-n type is not influenced by an electrochemical reaction occurred at an interface with the electrolyte. Also, the electrolyte of pH 7 has a more negative slope compared to the electrolyte of pH 1 at a potential area having a positive potential greater than 0 V. This is deemed that direct tunneling through the native oxide layer of the electrolyte of pH 7 is dominant compared to an interface pathway between the native oxide layer and the photoconductive material layer influenced by protons compared with that of the electrolyte of pH 1.

Next, the substrate and the electrolyte are connected to a first electrode and a second electrode connected to a power source, respectively. An example of the power source may include a controlled potential electrolyte apparatus (Potentiostat). The first electrode and the second electrode may be, for example, included within a three-electrode system.

Figure 4:
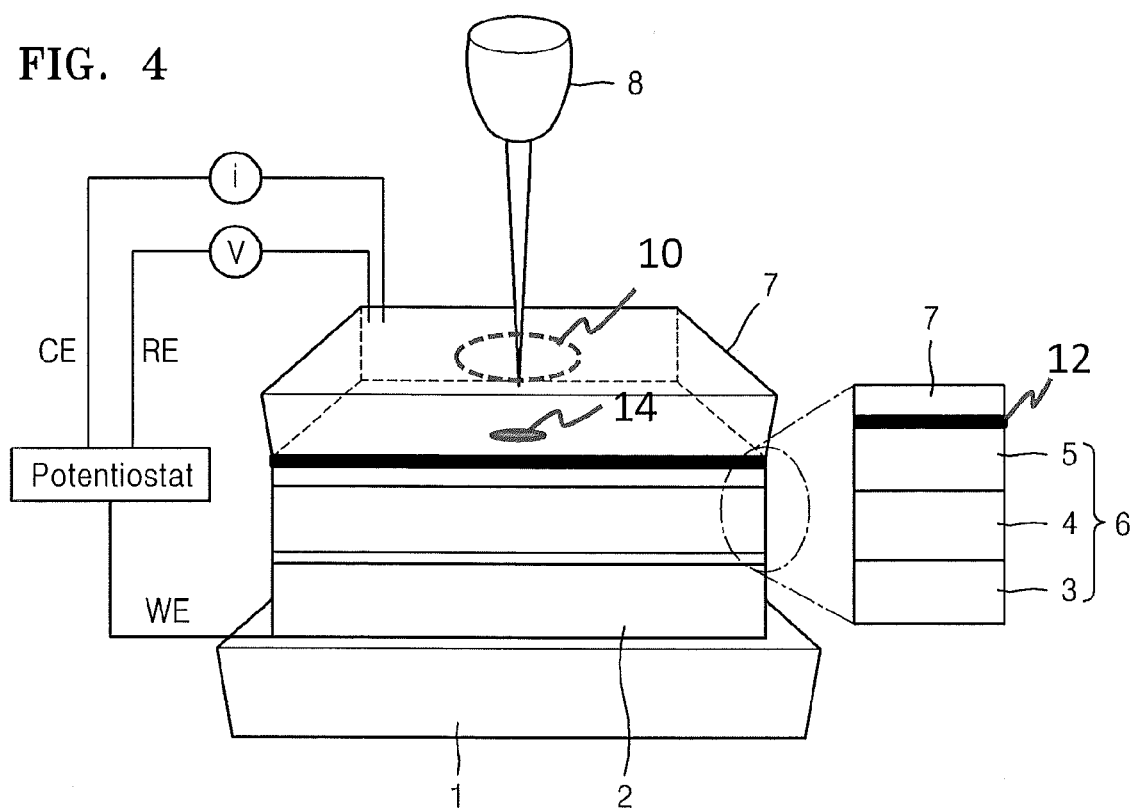
FIG. 4 is a schematic view of an apparatus to implement the method for forming a pattern according to an embodiment.

Then, a pattern is directly formed on the oxide layer of the substrate by selectively irradiating light from a light source to the electrolyte and applying a voltage to the first electrode or the second electrode. FIG. 4 is a schematic view of an apparatus to implement the method for forming a pattern according to an embodiment.

The light source may be at least one selected from a laser, a digital micromirror device (DMD), a liquid crystal display (LCD), a plasma display panel (PDP), a light-emitting diode (LED), and an organic light-emitting diode (OLED). A wavelength of the light source may be appropriately configured in consideration of a diffusion length of the photoconductive material layer included in the substrate.

Referring to FIG. 4, a substrate 2 is disposed on a piezoelectric stage 1. A photoconductive material layer 6 sequentially including a first photoconductive material layer of an n-type 3, a second photoconductive material layer of an i-type 4, and a third photoconductive material layer of a p-type 5 is disposed on the substrate 2. An oxide layer 12 is disposed on the photoconductive material layer 6 and comes into contact with an electrolyte 7. The substrate 2 and the electrolyte 7 are connected to a first electrode and a second electrode connected to a power source, respectively. A light is irradiated from a light source 8 to the area 10, on which a pattern is to be formed, on the electrolyte 7 and the pattern 14 is directly formed on the oxide layer of the substrate 2 by applying a voltage to the first electrode or the second electrode. For example, the pattern can be shown in FIGS. 6a to 6c.

A range of the applied voltage may be in a range of about −0.7 V to about −0.4 V vs. an Ag/AgCl electrode. Relationships between the range of the applied voltage, a line width of a nanopattern related to a duration time, and a size of particles included in the nanopattern may be confirmed in FIGS. 6A to 6C.

A shape of the nanopattern may be formed by placing the photoconductive material layer and the native oxide layer included in the substrate on, for example, a piezoelectric stage and moving the piezoelectric stage in XYZ directions. Also, the nanopattern may be formed by irradiating light itself patterned in a desired shape to the substrate without moving the substrate.

However, the method for forming a pattern may be used when a pattern is directly formed on a photoconductive material layer of a desired substrate, as well as, when a pattern is directly formed on an oxide layer of a desired substrate, and the method may include transferring the substrate including the pattern formed by using the method.

According to another aspect of an embodiment, a catalyst is prepared by using the method for forming a pattern. The catalyst is more appropriate than when a pattern is directly formed on a surface of original state that does not need a surface protection ligand.

According to another aspect of an embodiment, an electronic element is prepared by using the method for forming a pattern. Examples of the electronic element may include an LED display, a solar cell, or a biosensor. Also, the electronic element may be applied to an electrode, a sensor, and a wire.

EXAMPLE

Manufacture Example 1

Preparation of Substrate

A hydrogenated amorphous silicon (a-Si:H) photoconductive material layer sequentially including a p-type first photoconductive material layer having a thickness of 20 nm and an i-type second photoconductive material layer having a thickness of 500 nm was formed on an n-type silicon wafer substrate 100 having a thickness of 500 μm and a resistance in a range of about 0.001 Ωcm to about 0.003 Ωcm by using a plasma-enhanced chemical vapor deposition method. The n-type silicon wafer substrate including the hydrogenated amorphous silicon (a-Si:H) photoconductive material layer was exposed in the air for 4 weeks to form a native oxide layer having a thickness of about 3 nm on the second photoconductive material layer. Then, the photoconductive material layer, on which the native oxide layer is formed, was sonicated with 100 ml of a solution including acetone, isopropyl alcohol, methanol, and ultra-pure water (Barnstead Nanopure®) for 20 minutes and dried with nitrogen gas to prepare a substrate.

Manufacture Example 2

Preparation of Substrate

A hydrogenated amorphous silicon (a-Si:H) photoconductive material layer sequentially including a p-type first photoconductive material layer having a thickness of 20 nm, an i-type second photoconductive material layer having a thickness of 500 nm, and an n-type third photoconductive material layer having a thickness of 100 nm was formed on an n-type silicon wafer substrate 100 having a thickness of 500 μm and a resistance in a range of about 0.001 Ωcm to about 0.003 Ωcm by using a plasma-enhanced chemical vapor deposition method. The n-type silicon wafer substrate including the hydrogenated amorphous silicon (a-Si:H) photoconductive material layer was exposed in the air for 4 weeks to form a native oxide layer having a thickness of about 3 nm on the second photoconductive material layer. Then, the photoconductive material layer, on which the native oxide layer is formed, was sonicated with 100 ml of a solution including acetone, isopropyl alcohol, methanol, and ultra-pure water (Barnstead Nanopure®) for 20 minutes and dried with nitrogen gas to prepare a substrate.

Example 1

Formation of Pattern

An oxygen component was removed from the substrate prepared in Manufacture Example 2 by treating with nitrogen gas (99.9%) for 30 minutes, and then an electrolyte of pH 7 containing 0.1 mM of $H_2PtCl_4$ (available from Sigma-Aldrich) and 0.1 M of $K_2SO_4$ (available from Sigma-Aldrich) was made to come into contact with an area, on which a pattern is to be formed, on the native oxide layer of the substrate.

Then, the substrate and the electrolyte were connected to three electrodes connected to the power source, respectively. Here, the three electrodes included a working electrode which was prepared by lightly scratching a back surface of the substrate with a diamond knife, applying a Ga—In eutectic salt thereon, and connecting this to an aluminum conductive tape; a reference electrode of Ag/AgCl; and a counter electrode of a Pt wire, wherein the reference electrode and the counter electrode were prepared by immersing the electrodes in an electrolyte.

A He—Ne laser (available from LASOS Lasertechnik) with a wavelength of 632.8 nm and a power density of 10 mWcm$^{-2}$ was selectively irradiated onto the electrolyte, a potential pulse was applied to the working electrode with a rest potential at a voltage of 0.1 V for 5 seconds, and then a voltage of −0.4 V vs. an Ag/AgCl electrode was applied thereto to directly form a Pt nanopattern having a line width in a range of about 2 μm to about 10 μm on the native oxide layer. A shape of the Pt nanopattern was formed by placing the substrate including the photoconductive material layer and the native oxide layer on a piezoelectric stage (Nano-LP300, available from Mad City Labs, Inc.) and moving the piezoelectric stage in XYZ directions.

Example 2

Formation of Pattern

The substrate prepared in Manufacture Example 2 was treated with nitrogen gas (99.9%) for 30 minutes to remove oxygen component in the substrate, and an electrolyte of pH 8 prepared by adding hydrochloric acid to a solution including 5 mM $Na_2MoO_4$ (available from Sigma-Aldrich) and 0.1 M $Na_2S$ (available from Sigma-Aldrich) was made to come into contact with an area, on which a pattern on the native oxide layer of the substrate was to be formed.

Then, the substrate and the electrolyte were connected to three electrodes connected to a power source, respectively. Here, the three electrodes included a working electrode which was prepared by lightly scratching a back surface of the substrate with a diamond knife, applying a Ga—In eutectic salt thereon, and connecting this to an aluminum conductive tape; a reference electrode of Ag/AgCl; and a counter electrode of a Pt wire, wherein the reference electrode and the counter electrode were prepared by immersing the electrodes in an electrolyte.

A He—Ne laser (available from LASOS Lasertechnik) with a wavelength of 632.8 nm and a power density of 10 mWcm$^{-2}$ was selectively irradiated onto the electrolyte, a potential pulse was applied to the working electrode with a rest potential at a voltage of 0.1 V for 5 seconds, and then a voltage of −0.7 V vs. an Ag/AgCl electrode was applied thereto to directly form a $MoO_yS_z$ (where, $0 \leq y \leq 1$ and $1.9 \leq z \leq 2.1$) nanopattern having a line width in a range of about 3 μm to about 8 μm on the native oxide layer. A shape of the $MoO_yS_z$ (where, $0 \leq y \leq 1$ and $1.9 \leq z \leq 2.1$) nanopattern was formed by placing the substrate including the photoconductive material layer and the native oxide layer on a piezoelectric stage (Nano-LP300, available from Mad City Labs, Inc.) and moving the piezoelectric stage in XYZ directions.

Example 3

Formation of Pattern

The substrate prepared in Manufacture Example 2 was treated with nitrogen gas (99.9%) for 30 minutes to remove oxygen component in the substrate, and an electrolyte of pH 7 containing 120 mM $CdSO_4 \cdot 3H_2O$ (available from Sigma-Aldrich) and 1 mM $SeO_2$ (available from Sigma-Aldrich)

was made to come into contact with an area, on which a pattern on the native oxide layer of the substrate was to be formed.

Then, the substrate and the electrolyte were connected to three electrodes connected to a power source, respectively. Here, the three electrodes included a working electrode which was prepared by lightly scratching a back surface of the substrate with a diamond knife, applying a Ga—In eutectic salt thereon, and connecting this to an aluminum conductive tape; a reference electrode of Ag/AgCl; and a counter electrode of a Pt wire, wherein the reference electrode and the counter electrode were prepared by immersing the electrodes in an electrolyte.

A He—Ne laser (available from LASOS Lasertechnik) with a wavelength of 632.8 nm and a power density of 10 mWcm$^{-2}$ was selectively irradiated onto the electrolyte, a potential pulse was applied to the working electrode with a rest potential at a voltage of 0.2 V for 5 seconds, and then a voltage of −0.5 V vs. an Ag/AgCl electrode was applied thereto in two consecutive pulses for 20 milliseconds (ms) to directly form a CdSe nanopattern having a line width in a range of about 5 μm to about 10 μm on the native oxide layer. A shape of the CdSe nanopattern was formed by placing the substrate including the photoconductive material layer and the native oxide layer on a piezoelectric stage (Nano-LP300, available from Mad City Labs, Inc.) and moving the piezoelectric stage in XYZ directions.

Example 4

Formation of Pattern

The substrate prepared in Manufacture Example 2 was treated with nitrogen gas (99.9%) for 30 minutes to remove oxygen component in the substrate, and an electrolyte of pH 7 containing 10 mM EDOT (available from Sigma-Aldrich) and 5 mg/ml PSS (available from Sigma-Aldrich) was made to come into contact with an area, on which a pattern on the native oxide layer of the substrate was to be formed.

Then, the substrate and the electrolyte were connected to three electrodes connected to a power source, respectively. Here, the three electrodes included a working electrode which was prepared by lightly scratching a back surface of the substrate with a diamond knife, applying a Ga—In eutectic salt thereon, and connecting this to an aluminum conductive tape; a reference electrode of Ag/AgCl; and a counter electrode of a Pt wire, wherein the reference electrode and the counter electrode were prepared by immersing the electrodes in an electrolyte.

Then, the substrate and the electrolyte were connected to three electrodes connected to a power source, respectively. Here, the three electrodes included a working electrode which was prepared by lightly scratching a back surface of the substrate with a diamond knife, applying a Ga—In eutectic salt thereon, and connecting this to an aluminum conductive tape; a reference electrode of Ag/AgCl; and a counter electrode of a Pt wire, wherein the reference electrode and the counter electrode were prepared by immersing the electrodes in an electrolyte.

Atomic Force Microscope (AFM) Image

Figure 5:
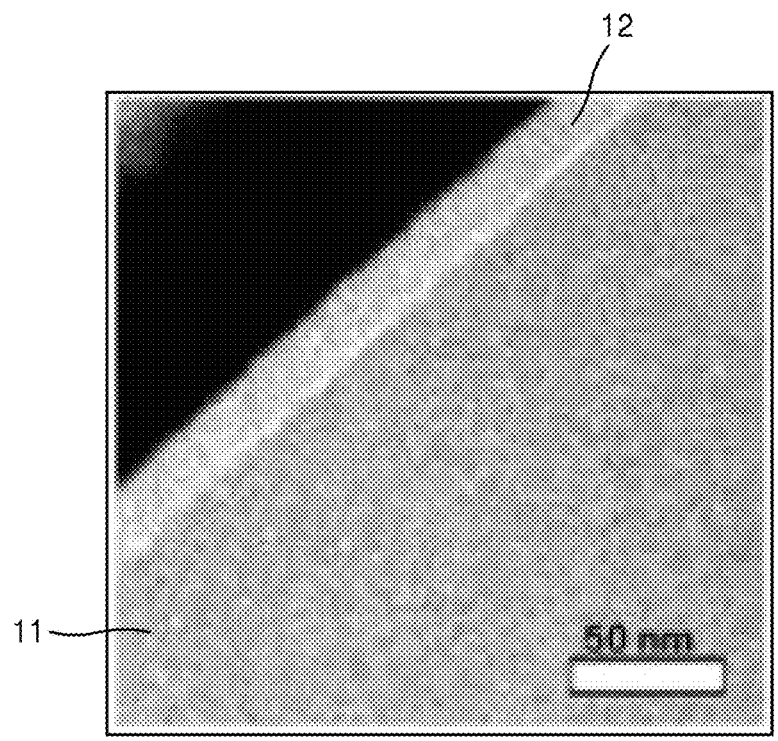
FIG. 5 is an atomic force microscope (AFM) image of a surface of the hydrogenated amorphous silicon (a-Si:H) third photoconductive material layer prepared in Example 1.

FIG. 5 is an atomic force microscope (AFM) image of a surface of the hydrogenated amorphous silicon (a-Si:H) third photoconductive material layer prepared in Example 1. The AFM was SPA-400 (available from Seiko Instrument).

Referring to the image of FIG. 5, it may be confirmed that a native oxide layer having a thickness in a range of about 2 nm to about 3 nm was formed on the surface of the hydrogenated amorphous silicon (a-Si:H) third photoconductive material layer prepared in Example 1.

Field Emission-Scanning Electron Microscopy (FE-SEM) Image

Figure 6A:
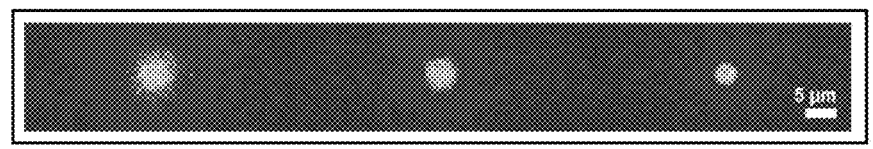
FIG. 6A is FE-SEM images of Pt nanopatterns formed on the native oxide layer by applying −0.4 V vs. an Ag/AgCl electrode for 2 seconds in 8 pulses, 4 pulses, or 2 pulses, respectively, in the same manner as in Example 1.
Figure 6B:
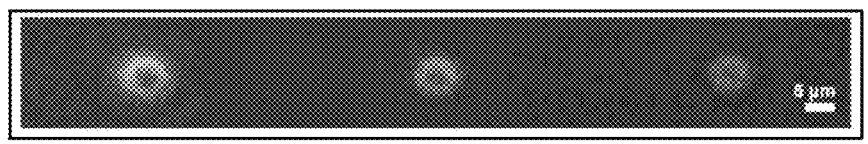
FIG. 6B is FE-SEM images of $MoO_yS_z$ nanopatterns formed on the native oxide layer by applying −0.7 V vs. an Ag/AgCl electrode for 4 seconds in 8 pulses, 4 pulses, or 2 pulses, respectively, in the same manner as in Example 2.
Figure 6C:
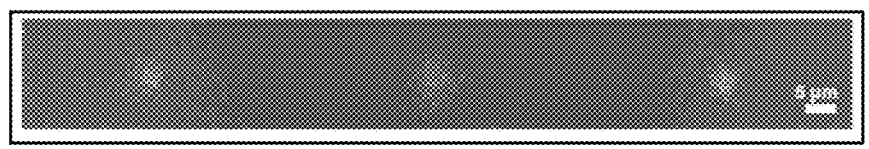
FIG. 6C is FE-SEM images of CdSe nanopatterns formed on the native oxide layer by applying −0.4 V vs. an Ag/AgCl electrode for 20 milliseconds in 8 pulses, 4 pulses, or 2 pulses, respectively, in the same manner as in Example 3.

FIGS. 6A to 6C are FE-SEM images of the Pt nanopattern, MoO$_y$S$_z$ nanopattern, and CdSe nanopattern formed on the native oxide layer by applying −0.4 V, −0.7 V, −0.4 V each vs. an Ag/AgCl electrode for 2 seconds, 4 seconds, and 20 milliseconds, respectively, in 8 pulses, 4 pulses, or 2 pulses in the same manner as in Examples 1 to 3. The FE-SEM was SUPRA 55VP (available from Carl Zeiss) at an acceleration voltage of 2 kV.

Referring to the images of FIGS. 6A to 6C, it may be confirmed that a pattern having a line width in a range of about 2 μm to about 10 μm was formed on the native oxide layer. Also, it may be confirmed that an average particle diameter of particles included in the Pt nanopattern, MoO$_y$S$_z$ nanopattern, and CdSe nanopattern (on the left) formed on the native oxide layer by applying −0.4 V, −0.7 V, −0.4 V each vs. an Ag/AgCl electrode for 2 seconds, 4 seconds, and 20 milliseconds in 8 pulses in the same manner as in Examples 1 to 3 was 70 nm, which was the longest, and an average particle diameter of particles included in the Pt nanopattern, MoO$_y$S$_z$ nanopattern, and CdSe nanopattern (on the right) formed on the native oxide layer by applying −0.4 V, −0.7 V, −0.4 V each vs. an Ag/AgCl electrode for 2 seconds, 4 seconds, and 20 milliseconds in 2 pulses in the same manner as in Examples 1 to 3 was 23 nm, which was the shortest. Most of the particles had uniform diameters.

In this regard, it may be known that a pulse duration time is proportional to the average particle diameter of the particles included in the Pt nanopattern, MoO$_y$S$_z$ nanopattern, or CdSe nanopattern.

Energy Dispersive X-Ray (EDX) Analysis

An energy dispersive X-ray (EDX) analysis was performed on a surface of the CdSe nanopattern prepared in Example 3. The results are shown in Table 1. The EDX analysis used SUPRA 55VP (available from Carl Zeiss) at an acceleration voltage of 2 kV.

TABLE 1

| Element | Atom % (at %) of each element | Error (at %) |
|---|---|---|
| O  | 1.83  | 1.98 |
| Si | 67.14 | 9.45 |
| P  | 0.15  | 0.17 |
| C  | 28.45 | 15.65 |
| Se | 1.21  | 0.78 |
| Cd | 1.22  | 0.87 |
| Total | 100 | |

Referring to Table 1, at % s of Cd and Se on a surface of the CdSe nanopattern prepared in Example 3 were 1.22 and 1.21, respectively, which was about 1:1, and thus it may be confirmed that the CdSe nanopattern was formed on the native oxide layer. Also, it was deemed that elements C, O, Si, and P were included in the native oxide layer and the amorphous silicon substrate.

Raman Spectrum

Figure 7:
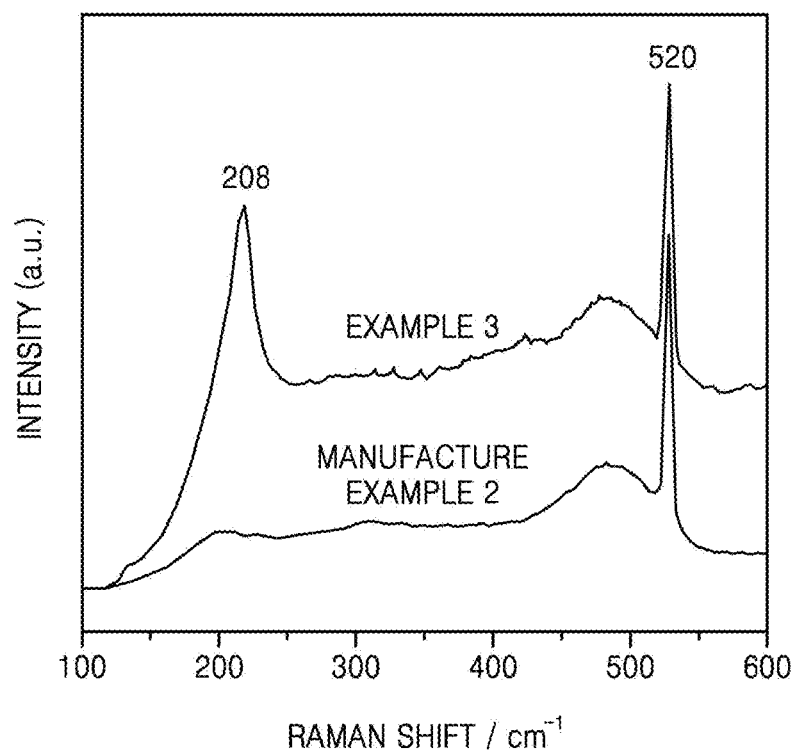
FIG. 7 shows the results of Raman spectrum of the CdSe nanpattern prepared in Example 3 and the substrate prepared in Manufacture Example 2.

FIG. 7 shows the results of Raman spectrum of the CdSe nanopattern prepared in Example 3 and the substrate prepared in Manufacture Example 2. In order to perform the Raman spectrum analysis, a homemade Ramboss Micro-Raman system spectrometer with a 632.8 nm He/Ne laser was used.

Referring to FIG. 7, the CdSe nanopattern prepared in Example 3 had a peak at about 208 cm$^{-1}$, and the peak corresponded to a longitudinal optical (LO) phonon mode of CdSe. However, the substrate prepared in Manufacture Example 2 did not have a peak at about 208 cm$^{-1}$.

The invention claimed is:

1. A method for forming a pattern, the method comprising:
    disposing a substrate on a piezoelectric stage;
    preparing the substrate sequentially including a photoconductive material layer and an oxide layer on a surface of the substrate; where the photoconductive material layer comprises at least one selected from hydrogenated amorphous silicon (a-Si:H), amorphous germanium, hydrogenated amorphous germanium/silicon (a-Ge:H/a-Si—H), amorphous selenium (a-Se), amorphous gallium (a-Ga), amorphous hematite, and amorphous titanium oxide;
    contacting an area on the oxide layer of the substrate on which a pattern is to be formed with an electrolyte;
    connecting the substrate and the electrolyte to a first electrode and a second electrode connected to a power source, respectively;
    irradiating light from a light source onto the electrolyte and onto the area on the oxide layer of the substrate on which the pattern is to be formed; and
    applying a voltage to the first electrode or the second electrode to form the pattern directly on the oxide layer of the substrate,
    wherein the pattern comprises at least one selected from Pt, MoO$_y$S$_z$ (where, 0≤y≤1, 1.9≤z≤2.1) and CdSe,
    wherein the oxide layer is a native oxide layer formed directly on an upper surface of the photoconductive material layer.

2. The method of claim 1, wherein the photoconductive material layer comprises a first photoconductive material layer of a p-type or an n-type and a second photoconductive material layer of an intrinsic-type (i-type).

3. The method of claim 2, wherein the photoconductive material layer further comprises a third photoconductive material layer of an n-type or a p-type.

4. The method of claim 1, wherein a thickness of the photoconductive material layer is in a range of about 200 nm to about 900 nm.

5. The method of claim 2, wherein a thickness of the first photoconductive material layer is in a range of about 10 nm to about 30 nm.

6. The method of claim 2, wherein a thickness of the second photoconductive material layer is in a range of about 200 nm to about 700 nm.

7. The method of claim 3, wherein a thickness of the third photoconductive material layer is in a range of about 50 nm to about 150 nm.

8. The method of claim 1, wherein the substrate is a conductive substrate.

9. The method of claim 1, wherein the substrate comprises metal, crystalline silicon, or indium tin oxide (ITO).

10. The method of claim 1, wherein a thickness of the substrate is in a range of about 100 nm to about 500 nm.

11. The method of claim 1, wherein a thickness of the oxide layer is in a range of about 0.1 nm to about 3 nm.

12. The method of claim 1, wherein the electrolyte comprises at least one selected from a Pt precursor, a MoO$_y$S$_z$ (where, 0≤y≤1 and 1.9≤z≤2.1) precursor, a CdSe precursor, and a poly(3,4-ethylenedioxythiophene):poly(styrenesulfonate) (PEDOT:PSS) precursor.

13. The method of claim 1, wherein a pH of the electrolyte is in a range of about 4 to about 7.

14. The method of claim 1, wherein the light source is one selected from a laser, a digital micromirror device (DMD), a liquid crystal display (LCD), a plasma display panel (PDP), a light-emitting diode (LED), and an organic light-emitting diode (OLED).

15. The method of claim 1, wherein a range of the applied voltage is in a range of about −0.7 V to about −0.4 V vs. an Ag/AgCl electrode.

16. An electronic element prepared by using the method of claim 1.

17. The electronic element of claim 16, wherein the electronic element comprises an LED display, a solar cell, or a biosensor.

* * * * *